(12) United States Patent
Chang et al.

(10) Patent No.: US 12,217,798 B2
(45) Date of Patent: *Feb. 4, 2025

(54) BANK DESIGN WITH DIFFERENTIAL BULK BIAS IN eFUSE ARRAY

(71) Applicant: Taiwan Semiconductor Manufacturing Company, Ltd., Hsinchu (TW)

(72) Inventors: Meng-Sheng Chang, Chubei (TW); Chia-En Huang, Xinfeng Township (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/362,198

(22) Filed: Jul. 31, 2023

(65) Prior Publication Data
US 2023/0377654 A1    Nov. 23, 2023

Related U.S. Application Data

(63) Continuation of application No. 17/448,486, filed on Sep. 22, 2021, now Pat. No. 11,756,622.

(60) Provisional application No. 63/175,699, filed on Apr. 16, 2021.

(51) Int. Cl.
| | | |
|---|---|---|
| G11C 17/18 | (2006.01) | |
| G11C 16/04 | (2006.01) | |
| G11C 16/12 | (2006.01) | |
| G11C 17/16 | (2006.01) | |
| H10B 20/25 | (2023.01) | |

(52) U.S. Cl.
CPC .......... *G11C 16/0483* (2013.01); *G11C 16/12* (2013.01); *G11C 17/165* (2013.01); *H10B 20/25* (2023.02)

(58) Field of Classification Search
CPC ... G11C 16/0483; G11C 16/12; G11C 17/165; G11C 17/16; H10B 20/25
USPC ..................................................... 365/225.7
See application file for complete search history.

(56) References Cited

U.S. PATENT DOCUMENTS

| | | | |
|---|---|---|---|
| 4,605,872 A | 8/1986 | Rung | |
| 6,335,893 B1 * | 1/2002 | Tanaka | G11C 5/147 257/E27.097 |
| 9,196,361 B2 | 11/2015 | Lee et al. | |
| 9,941,002 B2 * | 4/2018 | Ke | G11C 13/003 |
| 10,437,749 B2 * | 10/2019 | Yoon | G11C 13/0038 |
| 10,937,494 B2 * | 3/2021 | Boujamaa | G11C 11/1693 |

* cited by examiner

*Primary Examiner* — Tha-O H Bui
(74) *Attorney, Agent, or Firm* — FOLEY & LARDNER LLP

(57) ABSTRACT

A memory circuit includes a first memory cell including a first resistor; and a first transistor coupled to the first resistor, wherein a first bulk port of the first transistor is biased at a first voltage level; a second memory cell coupled to the first memory cell, the second memory cell including a second resistor; and a second transistor coupled to the second memory cell, wherein a second bulk port of the second transistor is biased at a second voltage level, wherein the second voltage level is less than the first voltage level.

20 Claims, 9 Drawing Sheets

BANK DESIGN WITH DIFFERENTIAL BULK BIAS IN eFUSE ARRAY

CROSS-REFERENCE TO RELATED APPLICATION

This application is a continuation of U.S. patent application Ser. No. 17/448,486, filed Sep. 22, 2021, which claims priority to and the benefit of U.S. Provisional Patent Application No. 63/175,699, filed Apr. 16, 2021, the entire contents of each of which are incorporated herein by reference for all purposes.

BACKGROUND

On a conventional bulk complementary metal-oxide-silicon (CMOS) process, in some embodiments, n-type MOS (NMOS) devices are formed in a p-well or substrate connected to ground (or the most negative supply in the circuit). In some embodiments, PMOS devices are formed in an n-well connected to the most positive supply. An alternative process is the deep n-well process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
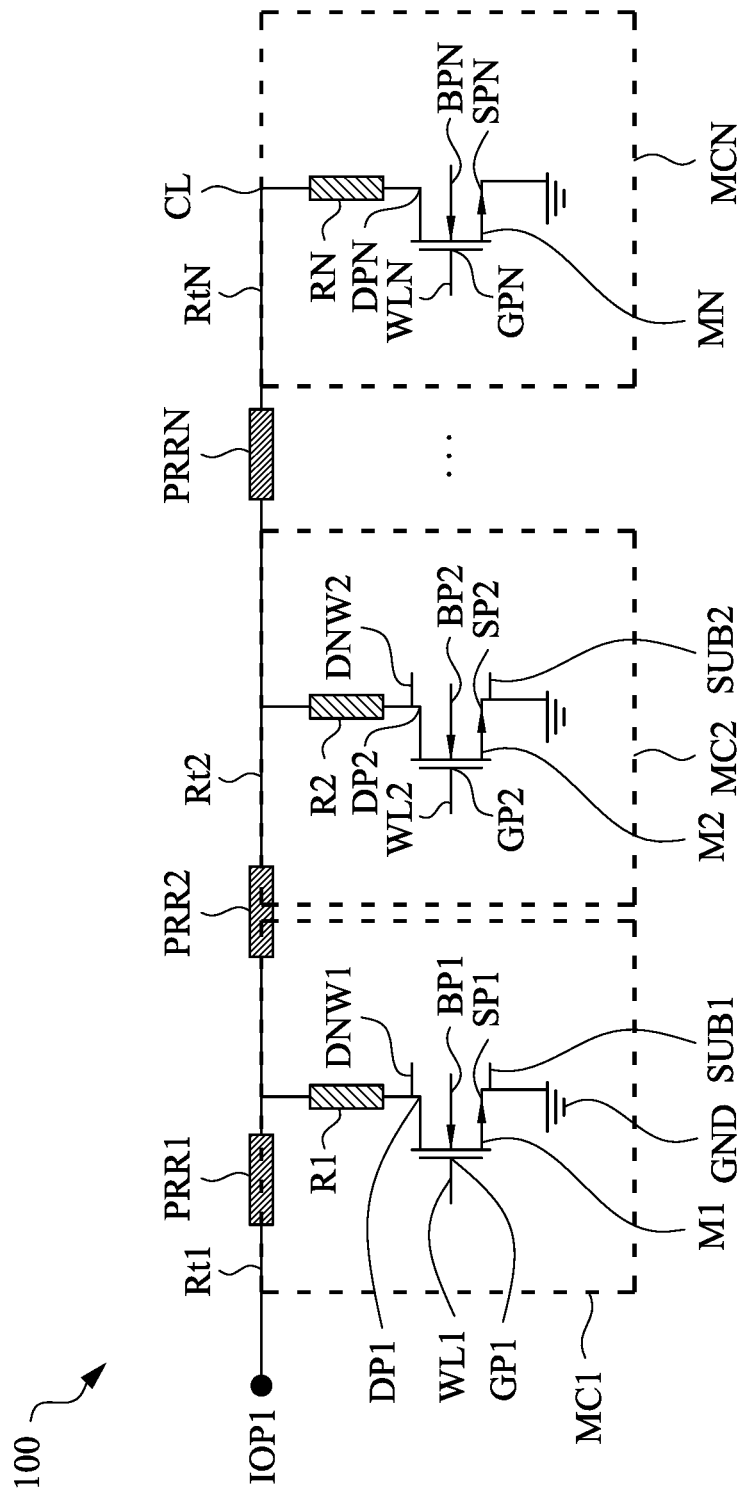
FIG. 1 illustrates a circuit diagram of memory circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a memory circuit, method, and device employing deep n-well devices. In some embodiments, some memory cells of the memory circuit can include a deep n-well transistor while other memory cells of the memory circuit can include a bulk memory transistor. In some embodiments, bulk ports of the deep n-well transistors can be biased differently from bulk ports of the bulk transistors. In some embodiments, bulk ports of the deep n-well transistors can be biased differently during read operation as compared to write operation. In some embodiments, each deep n-well transistor can be disposed in between two bulk transistors and each bulk transistor can be disposed in between two deep n-well transistors, which may be referred to as an interleaved arrangement.

Advantageously, embodiments of the disclosed memory circuit, method, and device can achieve several benefits. In some embodiments, memory leakage can be reduced by biasing the bulk ports of the deep n-well transistors at a higher voltage. Biasing the bulk ports of the deep n-well transistors higher causes a smaller voltage difference between a bulk port of the deep n-well transistor and the respective drain port, which results in less leakage. The memory read margin is improved by reducing the leakage. In addition, a lower voltage level can be used for the memory circuit by reducing the leakage level. Advantageously, by interleaving the deep n-well transistors with the bulk transistors, the circuit, method, and device can save area while still employing the benefit of reduced leakage.

FIG. 1 illustrates a circuit diagram of memory circuit 100, in accordance with some embodiments of the present disclosure. In some embodiments, the memory circuit 100 is referred to as a memory bank. The memory circuit 100 includes a number of memory cells MC1, MC2, ..., MCN. In some embodiments, the number of memory cells MC1-MCN is coupled to a common line CL. In some embodiments, each of the memory cells MC1-MCN is an eFuse cell, a resistive random-access memory (RRAM) cell, or any type of memory cell in which a resistor or memristor can store memory information such as a memory bit.

In some embodiments, each memory cell includes a resistor and a transistor coupled to the resistor. For example, the memory cell MC1 includes a resistor R1 and a transistor M1 coupled to the resistor R1, the memory cell MC2 includes a resistor R2 and a transistor M2 coupled to the resistor R2, and the memory cell MCN includes a resistor RN and a transistor MN coupled to the resistor RN.

In some embodiments, each of the resistors R1-RN are programmable. That is, in some embodiments, each of the resistors R1-RN can be programmed to have one of a number of resistive states. The resistor R1 is exemplary. In some examples, R1 can be changed from a first resistive state having low-resistance to a second resistive state having high-resistance in response to a first magnitude of current flowing through the resistor R1. The low-resistance can include any value such as, but not limited to, values less than 1 kilo-ohm. The high-resistance can include any value such as, but not limited to, values greater than 100 kilo-ohms. The first magnitude of current can include any value such as, but no limited to, values greater than 100 milli-amps.

Each of the transistors M1-MN can be turned on to allow current to flow through a respective one of the resistors R1-RN during a programming or sensing operation. For example, in response to the transistor M1 being turned on, the resistor R1 can be programmed or sensed. More details of operation are discussed below with respect to FIGS. 2B-2C. Each of the transistors M1-MN may be referred to as a pass transistor, an access transistor, etc.

Each of the transistors M1-MN includes a number of ports. Each of the ports can also be referred to as a terminal. Each of the transistors M1-MN includes a gate port, a drain port, and a source port. For example, the transistor M1 includes a gate port GP1, a drain port DP1, and a source port SP1, the transistor M2 includes a gate port GP2, a drain port DP2, and a source port SP2, and the transistor MN includes a gate port GPN, a drain port DPN, and a source port SPN. The gate port is coupled to a word line for receiving a word line voltage. For example, the gate port GP1 is coupled to the word line WL1, the gate port GP2 is coupled to the word line WL2, and the gate port GP3 is coupled to the word line WL3. A word line voltage at the gate port modulates a current between the drain port and the source port. For example, a word line voltage at the gate port GP1, received via the word line WL1, modulates a current between the drain port DP1 and the source port SP1. In some embodiments, in response to the gate port GP1 receiving a word line voltage of a first word voltage level, the drain port DP1 is coupled to the source port SP1. In some embodiments, in response to the gate port GP1 receiving a word line voltage of a second word voltage level, the drain port DP1 is decoupled from the source port SP1. A memory cell that receives the word line voltage of the first word voltage level such that the drain port is coupled to the source port may be referred to as a selected memory cell. In some embodiments, the drain ports DP1-DPN are coupled to the common line CL. In some embodiments, the source ports SP1-SPN are coupled to the ground GND.

In some embodiments, some transistors in the memory circuit 100, including the transistors M1 and M2, are deep n-well (DNW) transistors. Each DNW transistor includes a bulk port, a DNW port, and a p-substrate (PSUB) port. For example, the transistor M1 includes a bulk port BP1, a DNW port DNW1, and a PSUB port PSUB1, and the transistor M2 includes a bulk port BP2, a DNW port DNW2, and a PSUB port PSUB2.

In some embodiments, a first bulk bias voltage biases the bulk port BP1 of the transistor M1. In some embodiments, the first bulk bias voltage can be configured to have one of a number of voltage levels including, but not limited to, 0.3 V, 0 V, or any positive, non-zero voltage level. The first bulk bias voltage at the bulk port BP1 modulates a leakage current between the drain port DP1 and the bulk port BP1.

In some embodiments, a second bulk bias voltage biases the bulk port BP2 of the transistor M2. In some embodiments, a voltage level of the second bulk bias voltage is equal to a voltage level of the first bulk bias voltage. In other embodiments, the voltage level of the second bulk bias voltage is less than the voltage level of the first bulk bias voltage. In yet other embodiments, the voltage level of the second bulk bias voltage is greater than the voltage level of the first bulk bias voltage. The second bulk bias voltage at the bulk port BP2 modulates a leakage current between the drain port DP2 and the bulk port BP2.

A first reference voltage having a first reference voltage level (0 V, gnd, etc.) biases the PSUB port of each of the DNW transistors. For example, the first reference voltage biases the PSUB port PSUB1 of the transistor M1 and the PSUB port PSUB2 of the transistor M2. A second reference voltage having a second reference voltage level (VDD, voltage rail) biases the DNW port of each of the DNW transistors. For example, the second reference voltage biases the DNW port DNW1 of the transistor M1 and the DNW port DNW2 of the transistor M2. The second reference voltage level can include any voltage level including 0.75 V, a voltage level in a range from 0.6 V to 1 V, etc. In some embodiments, the DNW transistors are n-type metal-oxide-semiconductor (NMOS) DNW transistors. In some embodiments, the DNW transistors are p-type metal-oxide-semiconductor (PMOS) DNW transistors. DNW transistors are further described with respect to FIGS. 6 and 7.

In some embodiments, some transistors in the memory circuit 100, including the transistor MN, are bulk transistors. In some embodiments, the transistor MN includes a bulk port BPN. In some embodiments, the first reference voltage biases the bulk port BPN. In some embodiments, the first reference voltage has a first reference voltage level less than a voltage level of the first bulk voltage that biases the bulk port BP1 of the transistor M1. In some embodiments, the transistor MN does not have a DNW port or a PSUB port. In some embodiments, the bulk transistors are bulk NMOS transistors. In some embodiments, the bulk transistors are bulk PMOS transistors. Bulk transistors are further described with respect to FIGS. 6 and 7.

In some embodiments, the common line CL of the memory circuit 100 includes a number of routes Rt1, Rt2, ..., RtN. The routes Rt1, Rt2, ..., RtN have parasitic routing resistances PRR1, PRR2, ..., PRRN, respectively. For example, the route Rt1 has the parasitic routing resistance PRR1, the route Rt2 has the parasitic routing resistance PRR2, and the route RtN has the parasitic routing resistance PRRN. Although modeled as a lumped element, the parasitic routing resistance is distributed along the respective route. Each parasitic routing resistance can be any value including, but not limited to, values between 1 ohm and 1 kilo-ohm.

In some embodiments, a total routing resistance from the memory cell MC1 to an I/O port IOP1 is PRR1, a total routing resistance from the memory cell MC2 to the I/O port IOP1 is PRR1+PRR2, and a total routing resistance from the memory cell MCN to the I/O port IOP1 is PRR1+PRR2+PRRN. In some embodiments, the total routing resistance from MCN to IOP1 is greater than the total routing resistance from MC1 to IOP1 and the total routing resistance from MC2 to IOP2. Advantageously, in some embodiments, the greater total routing resistance may save area by sufficiently suppressing leakage current from the transistor MN of the memory cell MCN such that a bulk transistor (which is smaller in size than a DNW transistor) can be used. In some embodiments, the lesser total routing resistance may not sufficiently suppress leakage current from the transistors M1 and M2 of the memory cells MC1 and MC2, respectively, such that a DNW transistor can be used.

Figure 2A:
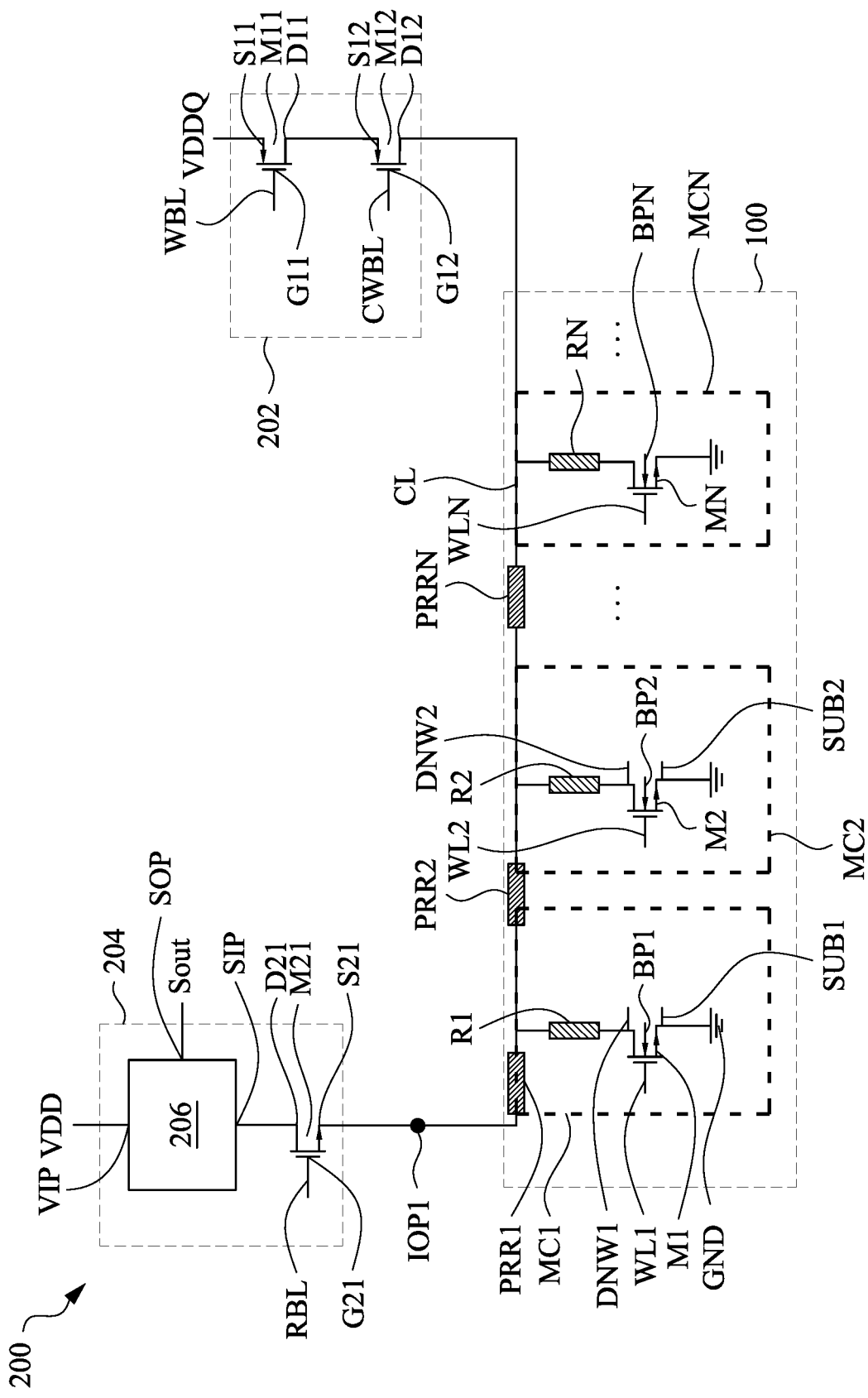
FIG. 2A illustrates a circuit diagram of a memory circuit, in accordance with some embodiments of the present disclosure.

FIG. 2A illustrates a circuit diagram of a memory circuit 200, in accordance with some embodiments of the present disclosure. In some embodiments, the memory circuit 200 is similar to the memory circuit 100 except that the memory circuit 200 includes a programming circuit 202 and a sensing circuit 204 coupled to the memory circuit 100.

In some embodiments, the programming circuit 202 includes a write access transistor M11. The write access transistor M11 provides a programming voltage (e.g., a third reference voltage) having a third reference voltage level (e.g., VDDQ) to a selected one of the memory cells MC1-MCN. The third reference voltage level can include any voltage level including 1.8 V, a voltage level in a range from 1.5 V to 2 V, etc. In some embodiments, a ratio of the third reference voltage level to the second reference voltage level can include any ratio such as a ratio in a range of 2 to 4.

In some embodiments, the write access transistor M11 includes a gate port G11, a drain port D11, and a source port S11. In some embodiments, the gate port G11 is coupled to a write bit line WBL for receiving a write line voltage. In some embodiments, the write access transistor M11 is a p-type MOS (PMOS) transistor. In other embodiments, the write access transistor M11 is an NMOS transistor. In some embodiments, in response to the gate port G11 receiving a write line voltage of a first write voltage level (e.g., 0 V), the drain port D11 is coupled to the source port S11. In some embodiments, in response to the gate port G11 receiving a write line voltage of a second write voltage level (e.g., VDDQ), the drain port D11 is decoupled from the source port S11. In some embodiments, the source port S11 is coupled to the programming voltage.

In some embodiments, the programming circuit 202 includes a write access cascode transistor M12. In some embodiments, the write access cascode transistor M12 protects the write access transistor M11 from breakdown by absorbing some of a voltage drop across the programming circuit 202. In some embodiments, the cascode write access cascode transistor M12 includes a gate port G12, a drain port D12, and a source port S12. In some embodiments, the gate port G12 is coupled to a cascode write bit line CWBL for receiving a cascode write line voltage. In some embodiments, the cascode write access transistor M12 is a PMOS transistor. In other embodiments, the cascode write access transistor M12 is an NMOS transistor.

In some embodiments, in response to the gate port G12 receiving a cascode write line voltage of a first cascode write voltage level (e.g., 0 V), the drain port D12 is coupled to the source port S12. In some embodiments, in response to the gate port G12 receiving a cascode write line voltage of a second cascode write voltage level (e.g., VDDQ), the drain port D12 is decoupled from the source port S12. In some embodiments, the source port S12 is coupled to the drain port D11 of the write access transistor M11. In some embodiments, the drain port D12 is coupled to the common line CL of the memory circuit 100.

In some embodiments, the sensing circuit 204 includes a read access transistor M21. The read access transistor M21 receives a sensing signal (e.g., voltage, current) from a selected one of the memory cells MC1-MCN. In some embodiments, the read access transistor M21 includes a gate port G21, a drain port D21, and a source port S21. In some embodiments, the gate port G21 is coupled to a read bit line RBL for receiving a read line voltage. In some embodiments, the read access transistor M21 is an NMOS transistor.

In other embodiments, the read access transistor M21 is a PMOS transistor. In some embodiments, in response to the gate port G21 receiving a read line voltage of a first read voltage level (e.g., VDD), the drain port D21 is coupled to the source port S21 and the sensing circuit 204 senses a sensing current provided by the selected memory cell. In some embodiments, in response to the gate port G21 receiving a read line voltage of a second read voltage level (e.g., 0 V), the drain port D21 is decoupled from the source port S21. In some embodiments, the source port S21 is coupled to the I/O port IOP1 of the common line CL of the memory circuit 100.

In some embodiments, the sensing circuit 204 includes a sensing circuit core 206. In some embodiments, the sensing circuit core 206 senses the sensing current provided by the selected memory cell via the read access transistor M21. The sensing circuit core 206 includes a number of ports including a sensing input port SIP, a sensing output port SOP, and a VDD input port VIP. In some embodiments, the sensing circuit core 206 receives the sensing current at the sensing input port SIP. In some embodiments, the sensing circuit core 206 receives the second reference voltage at the VDD input port VIP. In some embodiments, the sensing circuit core 206 provides a sensing output voltage Sout through the sensing output port SOP. In some embodiments, in response to sensing a selected cell that has not been programmed, the sensing circuit core 206 provides a sensing output voltage Sout having a first sensing voltage level (e.g., 0 V). In some embodiments, in response to sensing a selected cell that has been programmed, the sensing circuit core 206 provides a sensing output voltage Sout having a second sensing voltage level (e.g., VDD). The sensing circuit core 206 is further described with respect to FIG. 5.

Figure 2B:
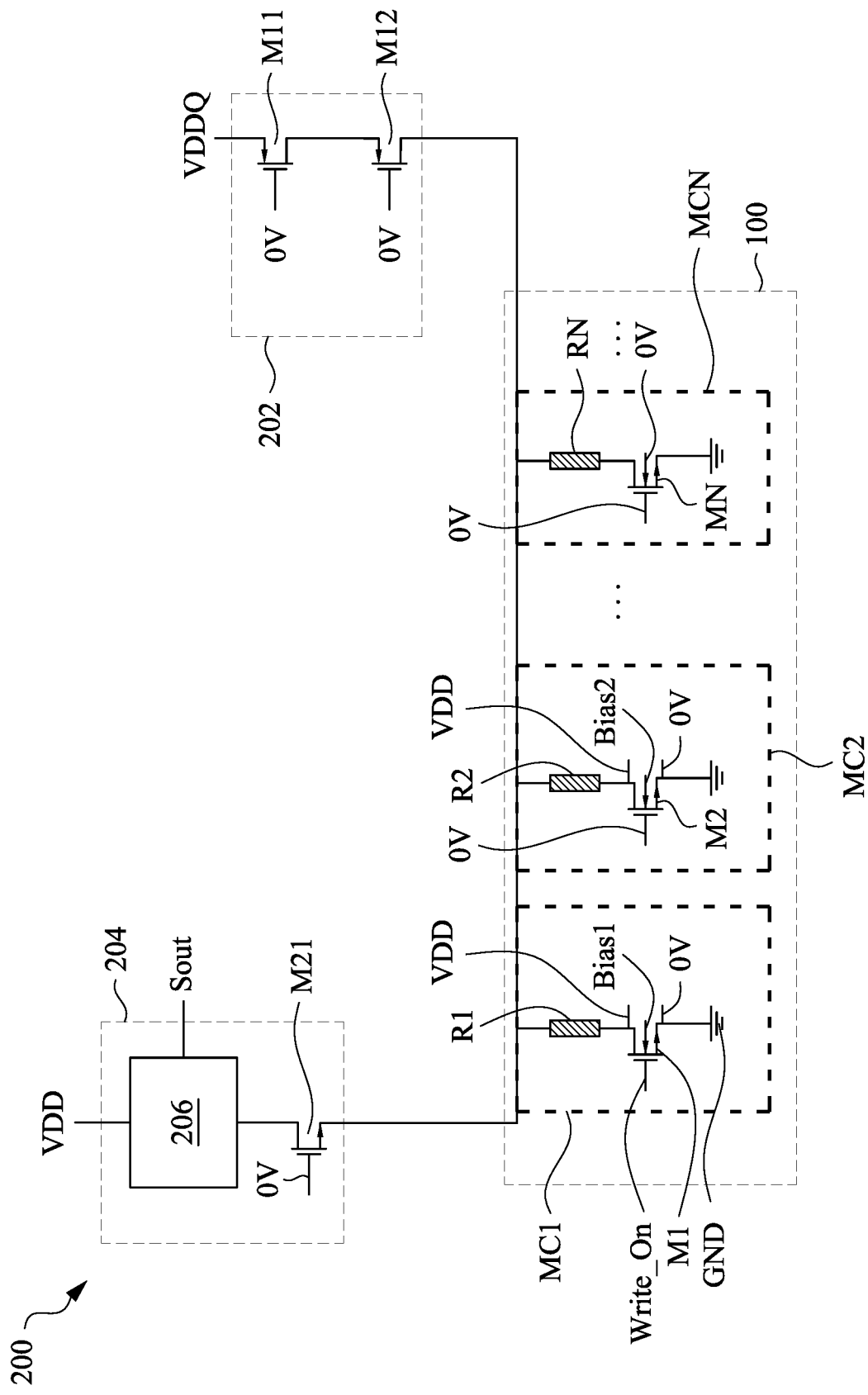
FIG. 2B illustrates a circuit diagram of the memory circuit during write operation, in accordance with some embodiments of the present disclosure.

FIG. 2B illustrates a circuit diagram of the memory circuit 200 during write (e.g., program) operation, in accordance with some embodiments of the present disclosure. As shown in FIG. 2B, MC1 is the selected memory cell for the write operation. During a write to MC1, the gate port G11 receives a word line voltage having a voltage level "Write_On," which can include any voltage level including 1.8 V, a voltage level in a range from 1.5 V to 2 V, etc. As a result of receiving the word line voltage at the gate port G11, the source port S11 of the transistor M1 is coupled to the drain port S11 of the transistor M1 and the transistor M1 is turned on.

During write operation, a bulk port of each of the DNW transistors is biased with a bulk bias voltage. For example, the bulk port BP1 of the DNW transistor M1 receives a first bulk bias voltage having a voltage level "Bias1," which can be 0 V, 0.1 V, 0.3 V, or any positive, non-zero voltage level. In some embodiments, the bulk port BP2 of the DNW transistor M2 receives a second bulk bias voltage having a voltage level "Bias2," which can be 0 V, 0.1 V, 0.3 V, or any positive, non-zero voltage level. During write operation, a bulk port of each of the bulk transistors is biased with 0 V. For example, the bulk port BPN of the bulk transistor MN receives 0 V.

In some embodiments, during write operation, the sensing circuit 204 (e.g., the sensing circuit core 206) is disabled or otherwise decoupled from the memory cell MC1. In some embodiments, the gate port G21 of the read access transistor M21 receives 0 V and the source port S21 of the transistor M21 is decoupled from the drain port D21 of the transistor M21. In some embodiments, during write operation, the memory cell MC1 is not coupled to the sensing circuit core 206 such that the memory cell MC1 does not provide a sensing current to the sensing circuit core 206.

In some embodiments, during write operation, the programming circuit 202 is enabled. In some embodiments, the gate port G11 of the write access transistor M11 receives 0 V and the source port S11 of the transistor M11 is coupled to the drain port D11 of the transistor M11. In some embodiments, the gate port G12 of the cascode write access transistor M12 receives 0 V and the source port S12 of the transistor M12 is coupled to the drain port D12 of the transistor M12. In some embodiments, during write operation, the common line CL of the memory circuit 100 is coupled to the source S11 to receive the third reference voltage having a voltage level of VDDQ.

A difference in voltage from the common line CL and the ground GND causes a current to flow from the common line CL, through the resistor R1 of the memory cell MC1, through the turned-on transistor M1 of the memory cell MC1, and to the ground GND. In some embodiments, the current causes the resistor R1 to change from a low-resistance state to a high-resistance state.

Figure 2C:
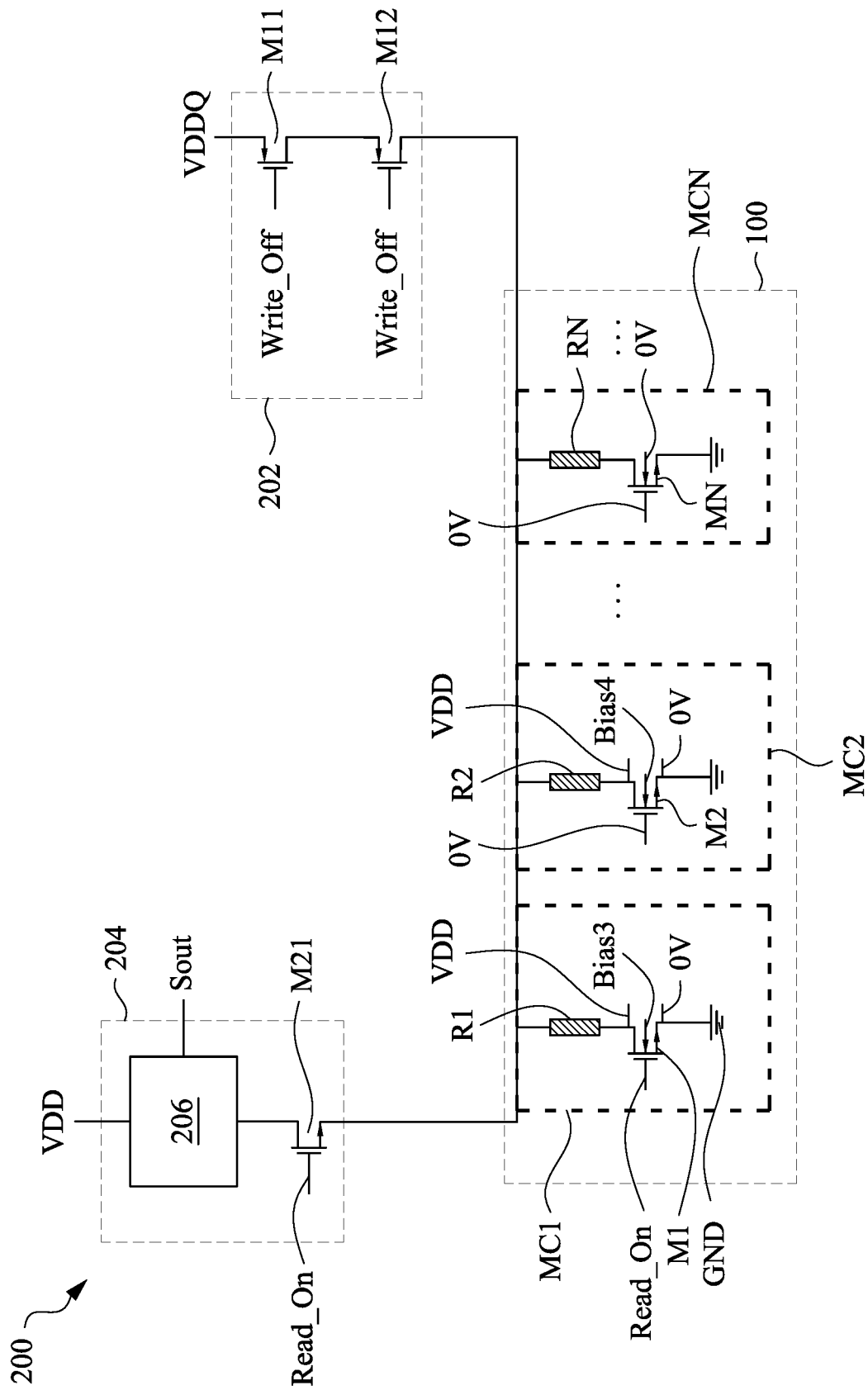
FIG. 2C illustrates a circuit diagram of the memory circuit during read operation, in accordance with some embodiments of the present disclosure.

FIG. 2C illustrates a circuit diagram of the memory circuit 200 during read (e.g., sense) operation, in accordance with some embodiments of the present disclosure. As shown in FIG. 2C, MC1 is the selected memory cell for the read operation. During a read from MC1, the gate port G11 receives a word line voltage having a voltage level "Read_On," which can include any voltage level including 0.75 V, a voltage level in a range from 0.6 V to 1 V, etc. As a result of receiving the word line voltage, the source port S11 of the transistor M1 is coupled to the drain port S11 of the transistor M1 and the transistor M1 is turned on.

During read operation, a bulk port of each of the DNW transistors is biased with a bulk bias voltage. For example, the bulk port BP1 of the DNW transistor M1 receives a first bulk bias voltage having a voltage level "Bias3," which can be 0 V, 0.1 V, 0.3 V, or any positive, non-zero voltage level. In some embodiments, the voltage level "Bias3" during read operation is greater than the voltage level "Bias1" during write operation. Advantageously, having a first bulk bias voltage with a higher voltage during read operation reduces bulk leakage to the sensing circuit 204 via drain port DP1 level by reducing a voltage difference between the bulk port BP1 and the drain port DP1. Thus, the sensing circuit 204 can provide a more accurate sensing output voltage if the sensing circuit 204 receives less leakage. In some embodiments, the bulk port BP2 of the DNW transistor M2 receives a second bulk bias voltage having a voltage level "Bias4," which can be 0.1 V, 0.3 V, or any positive, non-zero voltage level. In some embodiments, the voltage level "Bias4" during read operation is greater than the voltage level "Bias2" during write operation. During read operation, a bulk port of each of the bulk transistors is biased with 0 V. For example, the bulk port BPN of the bulk transistor MN receives 0 V.

In some embodiments, during read operation, the programming circuit 202 is disabled or otherwise decoupled from the memory cell MC1. In some embodiments, the gate port G11 of the write access transistor M11 receives a write line voltage having a voltage level "Write_Off" and the source port S11 of the transistor M11 is decoupled from the drain port D11 of the transistor M11. In some embodiments, the gate port G12 of the cascode write access transistor M12 receives a write line voltage having the voltage level "Write_Off" and the source port S12 of the transistor M12 is decoupled from the drain port D12 of the transistor M12. In some embodiments, the voltage level "Write_Off" is any voltage level including 1.8 V, a voltage level in a range from 1.5 V to 2 V. In some embodiments, the voltage level "Write_Off" is equal to VDDQ. In some embodiments, during read operation, the common line CL of the memory circuit 100 is decoupled from the source S11 such that the common line CL does not receive the third reference voltage having a voltage level of VDDQ.

In some embodiments, during read operation, the sensing circuit 204 is enabled. In some embodiments, the gate port G21 of the read access transistor M21 receives a read line voltage having the voltage level "Read_On" and the source port S21 of the transistor M21 is coupled to the drain port D21 of the transistor M21. In some embodiments, during read operation, the memory cell MC1 is coupled to the sensing circuit core 206 such that the memory cell MC1 provides a sensing current to the sensing circuit core 206.

A difference in voltage from the VDD input port VIP of the sensing circuit core 206 and the ground GND causes a sensing current to flow from the sensing circuit core 206, through the resistor R1 of the memory cell MC1, through the turned-on transistor M1 of the memory cell MC1, and to the ground GND. In some embodiments, the sensing circuit core 206 provides a sensing output voltage based on the sensing current received from the memory cell MC1.

Figure 3:
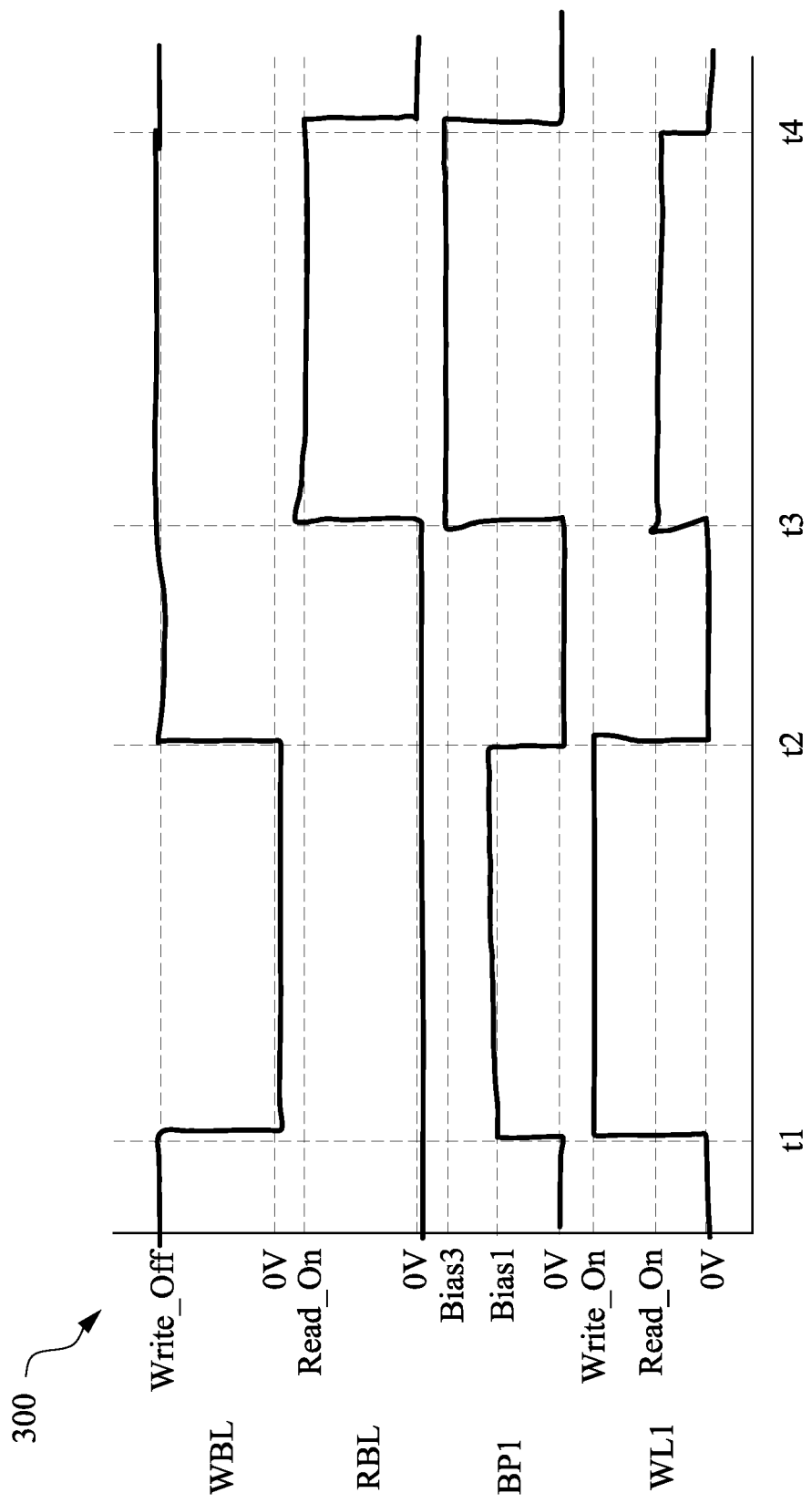
FIG. 3 illustrates a timing diagram for write and read operations of the memory circuit of FIGS. 2B-2C, in accordance with some embodiments of the present disclosure.

FIG. 3 illustrates a timing diagram 300 for write and read operations of the memory circuit 200 of FIG. 2A. From time t1 to time t2, the memory cell MC1 is being written to. In some embodiments, a time period from the time t1 to the time t2 is referred to as a first time period. In some embodiments, at time t1, the (PMOS) write access transistor M11 receives 0 V from the write bit line WBL, enabling the write access transistor M11. In some embodiments, at time t1, the (NMOS) read access transistor M21 receives 0 V from the read bit line RBL, disabling the read access transistor M21. In some embodiments, at time t1, the bulk port BP1 receives the bulk bias voltage having the voltage level "Bias1." In some embodiments, at time t1, the memory cell MC1 receives the word line voltage having the voltage level "Read_On," enabling the memory cell MC1.

In some embodiments, at time t2, the write access transistor M11 receives "Write_Off" from the write bit line WBL, disabling the write access transistor M11. In some embodiments, at time t2, the read access transistor M21 receives 0V and remains disabled. In some embodiments, at time t2, the bulk port BP1 receives 0 V. In some embodiments, at time t2, the memory cell MC1 receives 0 V, disabling the memory cell MC1.

From time t3 to time t4, the memory cell MC1 is being read from. In some embodiments, a time period from the time t3 to the time t4 is referred to as a second time period. In some embodiments, at time t3, the write access transistor M11 receives a write line voltage having the voltage level "Write_Off" from the write bit line WBL and remains disabled. In some embodiments, at time t3, the read access transistor M21 receives a read line voltage having the voltage level "Read_On" from the read bit line RBL, enabling the read access transistor M21. In some embodiments, at time t3, the bulk port BP1 receives the bulk bias voltage having the voltage level "Bias3." In some embodiments, the voltage level "Bias3" is greater than the voltage level "Bias1". In some embodiments, the voltage level "Bias3" is a non-zero voltage and the voltage level "Bias1" is 0 V. In some embodiments, at time t3, the memory cell MC1 receives the word line voltage having the voltage level "Read_On," enabling the memory cell MC1.

In some embodiments, at time t4, the write access transistor M11 receives "Write_Off" from the write bit line WBL and remains disabled. In some embodiments, at time t4, the read access transistor M21 receives 0 V, disabling the read access transistor M21. In some embodiments, at time t4, the bulk port BP1 receives 0 V. In some embodiments, at time t4, the memory cell MC1 receives 0 V, disabling the memory cell MC1.

Figure 4:
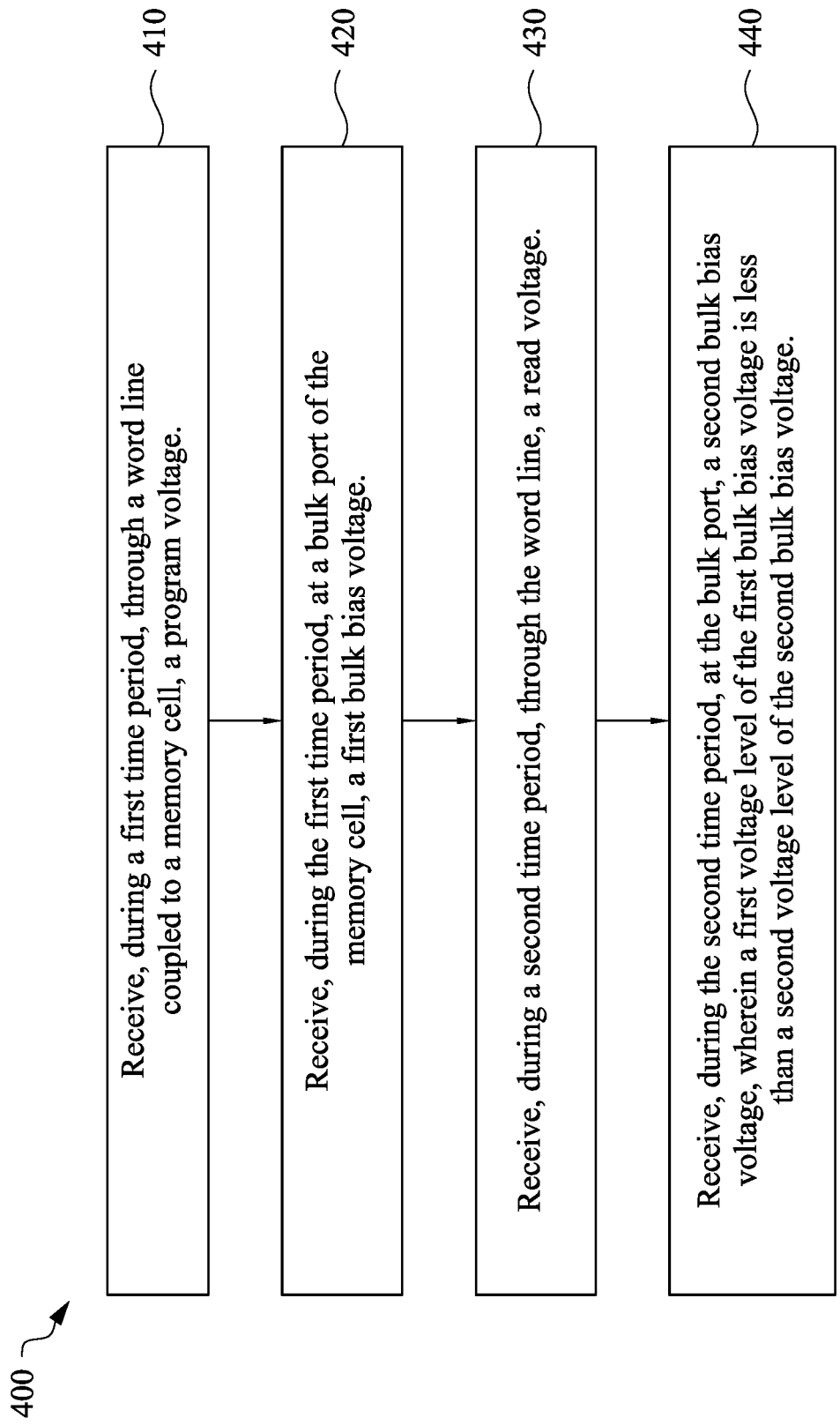
FIG. 4 illustrates a flowchart of a method to operate a memory circuit, in accordance with some embodiments of the present disclosure.

FIG. 4 illustrates a flowchart of a method 400 to operate the memory circuit 200, in accordance with some embodiments of the present disclosure. It is noted that the method 400 is merely an example and is not intended to limit the present disclosure. Accordingly, it is understood that additional operations may be provided before, during, and after the method 400 of FIG. 4, and that some other operations may only be briefly described herein. In some embodiments, the method 400 is performed by the memory circuit 200.

The method 400 starts with operation 410 of receiving, during a first time period (e.g., from time t1 to time t2 in FIG. 3), through a word line (e.g., the word line WL1 of FIG. 1) coupled to a memory cell (e.g., the memory cell MC1 of FIG. 1), a program voltage (e.g., "Write_On" in FIG. 2B). The method 400 continues to operation 420 of receiving, during the first time period, at a bulk port (e.g., the bulk port BP1 of FIG. 1) of the memory cell, a first bulk bias voltage (e.g., "Bias1" of FIG. 2B). In some embodiments, during the first time period, the method includes receiving, at a second bulk port (e.g., the bulk port BP2 of FIG. 1) of a second memory cell (e.g., the memory cell MC2 of FIG. 1 or the memory cell MCN of FIG. 1), the first bulk bias voltage. In some embodiments, during the first time period, the method includes receiving, in a sensing circuit (e.g., the sensing circuit 204 of FIG. 2A) coupled to the memory cell, a read disable voltage (e.g., 0 V) and receiving, in a programming circuit (e.g., the programming circuit 202 of FIG. 2A) coupled to the memory cell, a program enable voltage (e.g., 0 V). In some embodiments, the order of operations 410 and 420 may be reversed or the operations 410 and 420 may happen in parallel.

The method 400 continues to operation 430 of receiving, during a second time period (e.g., from time t3 to time t4 in FIG. 3), through the word line, a read voltage (e.g., "Read_on" in FIG. 2C). The method 400 continues to operation 440 of receiving, during the second time period, at the bulk port, a second bulk bias voltage (e.g., "Bias3" of FIG. 2C). In some embodiments, a first voltage level of the first bulk bias voltage is less than a second voltage level of the second bulk bias voltage. In some embodiments, the second voltage level is a positive, non-zero voltage and the first voltage is 0 V. In some embodiments, each of the first voltage level and the second voltage level is a positive, non-zero voltage. In some embodiments, the order of operations 430 and 440 may be reversed or the operations 430 and 440 may happen in parallel.

In some embodiments, during the second time period, the method includes receiving, at the second bulk port of the second memory cell, the second bulk bias voltage. In other embodiments, during the second time period, the method includes receiving, at the second bulk port of the second memory cell, the first bulk bias voltage. In some embodiments, during the second time period, the method includes receiving, in the sensing circuit, a read enable voltage (e.g., "Read_On" of FIG. 2C) and receiving, in the programming circuit, a program disable voltage (e.g., "Write_Off" of FIG. 2C).

Figure 5:
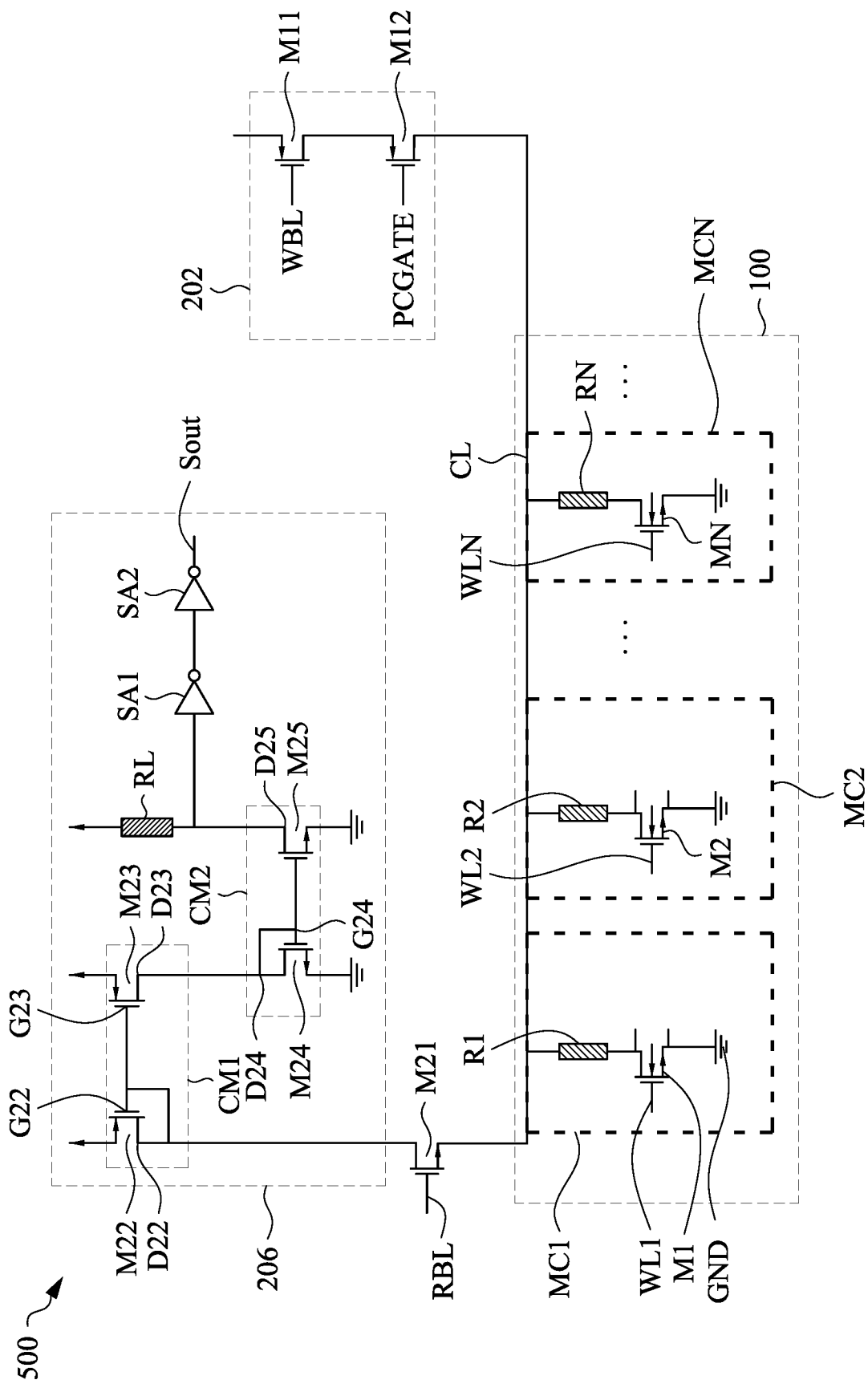
FIG. 5 illustrates a circuit diagram of a memory circuit including an implementation of a sensing circuit core, in accordance with some embodiments of the present disclosure.

FIG. 5 illustrates a circuit diagram of a memory circuit 500 including an implementation of the sensing circuit core 206, in accordance with some embodiments of the present disclosure. The sensing circuit core 206 receives a sensing current from the selected memory cell and provides a sensing output voltage Sout. In some embodiments, the sensing circuit core 206 includes current mirrors CM1 and CM2. The current mirrors CM1 and CM2 can increase the sensing current to generate a second sensing current that flows through a load resistance.

The current mirror CM1 includes a diode-connected transistor M22 that is coupled to the read access transistor M21 and a transistor M23 that is coupled to the diode-connected transistor M22. In some embodiments, the diode-connected transistor M22 includes a drain port D22 coupled to the drain port D21 of the read access transistor M21 and a gate port G22 that is coupled to the drain port D22. In some embodiments, the transistor M23 includes a drain port D23 and a gate port G23 coupled to the gate port G22 of the transistor M22. In some embodiments, the diode-connected transistor M22 and the transistor M23 are PMOS transistors.

The current mirror CM2 includes a diode-connected transistor M24 that is coupled to the transistor M23 and a transistor M25 that is coupled to the diode-connected transistor M24. In some embodiments, the diode-connected transistor M24 includes a drain port D24 coupled to the drain port D23 of the transistor M21 and a gate port G24 that is coupled to the drain port D24. In some embodiments, the transistor M25 includes a drain port D25 and a gate port G25 coupled to the gate port G24 of the transistor M24. In some embodiments, the diode-connected transistor M24 and the transistor M25 are NMOS transistors. In some embodiments, the transistor M25 provides a second current. In some embodiments, a ratio of the second current and the current received by the sensing circuit core 206 is any ratio such as a ratio in a range of 4 to 100.

In some embodiments, the sensing circuit core 206 includes a load resistance RL to receive the second sensing current and to provide a sensing input voltage to a sensing amplifier. In some embodiments, the sensing circuit core 206 includes sensing amplifiers SA1 and SA2.

In some embodiments, in response to receiving a sensing input voltage having a voltage level greater than a predetermined sensing threshold (e.g., VDD/2), the sensing amplifier SA1 provides an internal sensing voltage having a voltage level of the first reference voltage level (e.g., 0 V) to the sensing amplifier SA2. In some embodiments, in response to receiving a sensing input voltage having a voltage level less than the predetermined sensing threshold, the sensing amplifier SA1 provides an internal sensing voltage having a voltage level of the second reference voltage level (e.g., VDD) to the sensing amplifier SA2.

In some embodiments, in response to receiving an internal sensing voltage having a voltage level greater than the predetermined sensing threshold, the sensing amplifier SA2 provides a sensing output voltage having a voltage level of the first reference voltage level (e.g., 0 V). In some embodiments, in response to receiving an internal sensing voltage having a voltage level less than the predetermined sensing threshold, the sensing amplifier SA2 provides a sensing output voltage having a voltage level of the second reference voltage level (e.g., VDD).

Figure 6:
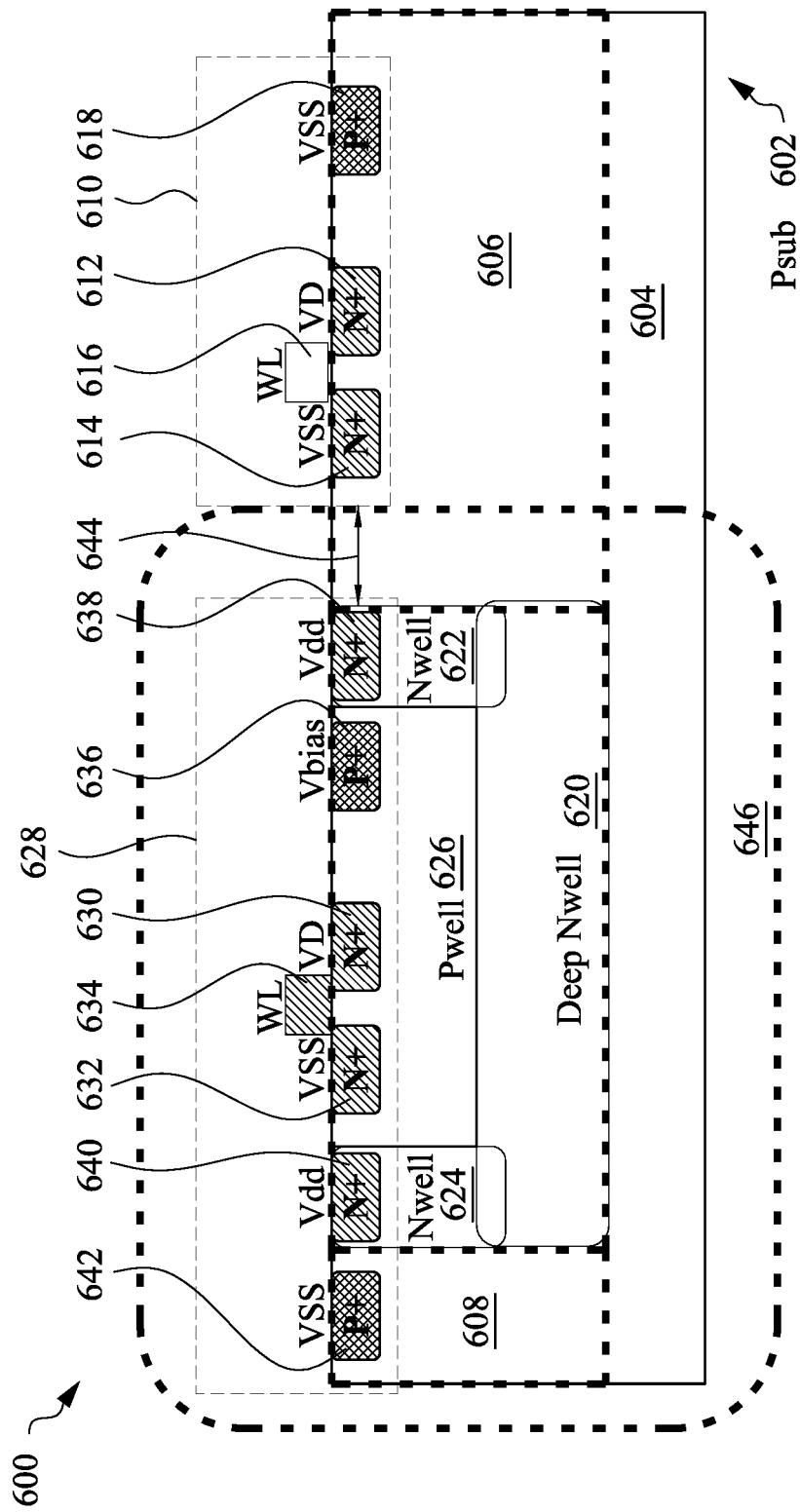
FIG. 6 illustrates a memory device, in accordance with some embodiments of the present disclosure.

FIG. 6 illustrates a memory device 600, in accordance with some embodiments of the present disclosure. The memory device 600 can be an implementation of a DNW transistor (e.g., the transistor M1 of the memory circuit 100 of FIG. 1) and a bulk transistor (e.g., the transistor MN of the memory circuit 100 of FIG. 1). The memory device 600 includes a PSUB 602. The PSUB 602 includes a first portion 604, a second portion 606 disposed over the first portion 604, and a third portion 608 disposed over the first portion 604.

The memory device 600 includes a bulk transistor device 610 disposed over the second portion 606 of the PSUB 602. The bulk transistor device 610 includes a drain electrode 612, a source electrode 614, a gate electrode 616, and a bulk electrode 618. In some embodiments, the bulk transistor device 610 is an implementation of the bulk transistor MN of FIG. 1, wherein the drain electrode 612 is the drain port DPN, the source electrode 614 is the source port SPN, the gate electrode 616 is the gate port GPN, and the bulk electrode 618 is the bulk port BPN.

In some embodiments, the memory device 600 includes a DNW 620 disposed over the first portion 604 of the PSUB 602. In some embodiments, the memory device 600 includes a pair of n-wells 622 and 624 disposed over the DNW 620. In some embodiments, the memory device 600 includes a p-well 626 disposed over the DNW 620 and in between the pair of n-wells 622 and 624.

The memory device 600 includes a DNW transistor device 628 disposed over the first portion 604 of the PSUB 602. The DNW transistor device 628 includes a drain electrode 630, a source electrode 632, a gate electrode 634, and a bulk electrode 636, a pair of DNW electrodes 638 and 640 and a PSUB electrode 642. In some embodiments, the drain electrode 630, the source electrode 632, the gate electrode 634, and the bulk electrode 636 are disposed over the p-well 626. In some embodiments, the DNW electrode 638 is disposed over the n-well 622, the DNW electrode 640 is disposed over the n-well 624, and the PSUB electrode 642 is disposed over the third portion 608 of the PSUB 602. In some embodiments, the DNW transistor device 628 is an implementation of the DNW transistor MC1 of the FIG. 1, wherein the drain electrode 630 is the drain port DP1, the source electrode 632 is the source port SP1, the gate electrode 634 is the gate port GP1, the bulk electrode 636 is the bulk port BP1, the pair of DNW electrodes 638 and 640 are the DNW port DNW1, and the PSUB electrode 642 is the PSUB port SUB1.

In some embodiments, the memory device 600 includes a distance 644 in between the bulk transistor device 610 and the DNW transistor device 628. In some embodiments, the distance 644 ensures proper fabrication of the memory device 600. In some embodiments, a clearance 646 determines a minimum distance from a DNW transistor device such as the DNW transistor device 628. In some embodiments, a bulk transistor device such as the bulk transistor device 610 has a smaller corresponding clearance or no corresponding clearance. Advantageously, by disposing a bulk transistor device (e.g., the bulk transistor device 610) next to a DNW transistor device (e.g., the DNW transistor device 628), the distance 644 is reduced compared to if another DNW transistor device is disposed next to the DNW transistor device.

Figure 7:
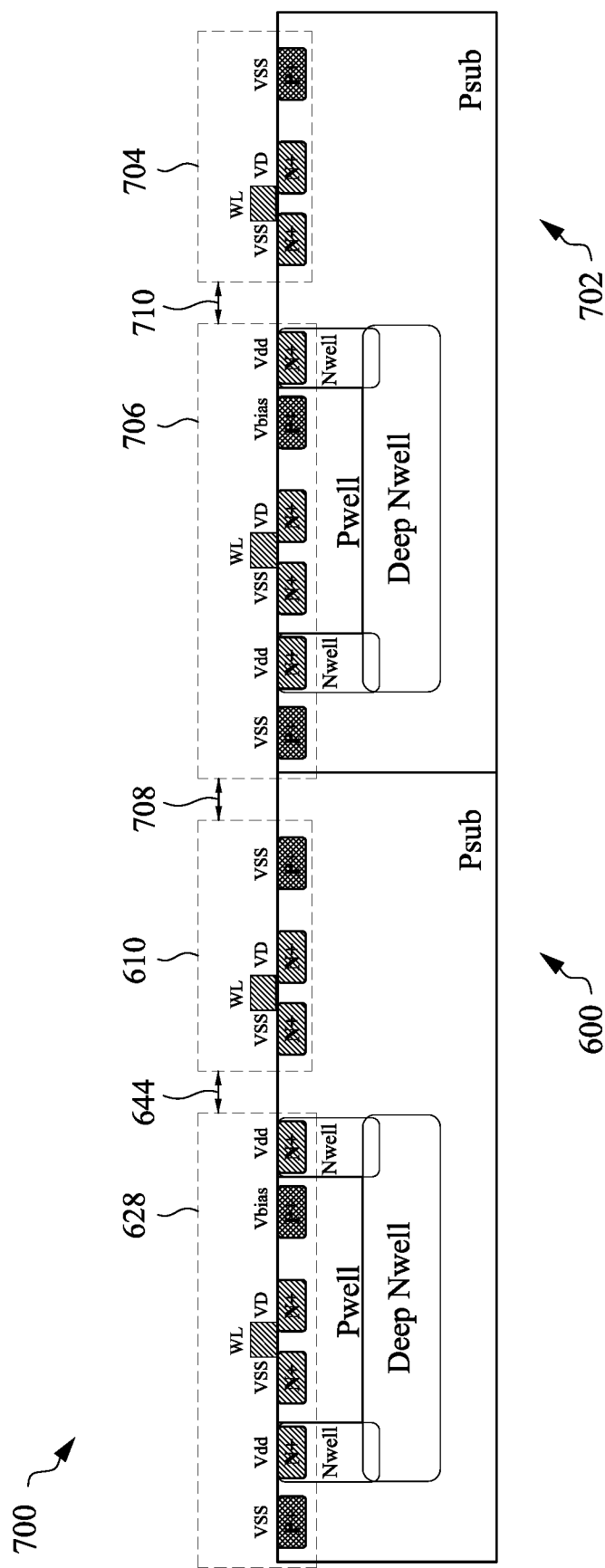
FIG. 7 illustrates another memory device, in accordance with some embodiments of the present disclosure.

FIG. 7 illustrates a memory device 700, in accordance with some embodiments of the present disclosure. The memory device 700 is similar to the memory device 600 except that the memory device 700 includes more transistor devices than the memory device 600. In some embodiments, the memory device 700 includes another memory device 702 disposed next to the memory device 600. The memory device 702 includes a bulk transistor device 704 and a DNW transistor device 706.

In some embodiments, the transistors of the memory device 700 are interleaved such that each bulk transistor device is disposed between a pair of DNW transistor devices (or at one end of the memory device 700) and each DNW transistor device is disposed between a pair of bulk transistor devices (or at another end of the memory device 700). For example, the bulk transistor device 610 is disposed next to the DNW transistor device 628, the DNW transistor device 706 is disposed next to the bulk transistor device 610, and the bulk transistor device 704 is disposed next to the DNW transistor device 706.

Advantageously, such an interleaved arrangement maximizes the number of DNW transistor devices while minimizing the area of the memory device 700 by reducing a distance between each adjacent pair of devices. For example, a distance 644 between the transistors 610 and 628 is reduced, a distance 708 between the transistors 610 and 706 is reduced, and a distance 710 between the transistors 706 and 704 is reduced, as compared to having all DNW transistor devices.

In some aspects of the present disclosure, a memory circuit is disclosed. In some aspects, the memory circuit includes a first memory cell including a first resistor; and a first transistor coupled to the first resistor, wherein a first bulk port of the first transistor is biased at a first voltage level; a second memory cell coupled to the first memory cell, the second memory cell including a second resistor; and a second transistor coupled to the second memory cell, wherein a second bulk port of the second transistor is biased at a second voltage level, wherein the second voltage level is less than the first voltage level.

In some aspects, the first transistor is a deep n-well (DNW) transistor and the second transistor is a bulk transistor. In some aspects, each of the first transistor and the second transistor is a deep n-well (DNW) transistor. In some aspects, the first resistor is coupled to first routing having a first resistance and the second resistor is coupled to second routing having a second resistance greater than the first resistance.

In some aspects, the first voltage level is a positive, non-zero voltage and the second voltage is zero volts. In some aspects, each of the first voltage level and the second voltage is a positive, non-zero voltage. In some aspects, the first memory cell is a first electronic fuse (eFuse) and the second memory cell is a second eFuse. In some aspects, the first eFuse is not programmed and the second eFuse is programmed.

In some aspects, the memory circuit further includes a sensing circuit coupled to the first eFuse, wherein, in response to the sensing circuit sensing the first eFuse, the first eFuse provides a signal having a voltage level of zero volts.

In some aspects, the memory circuit further includes a sensing circuit coupled to the second eFuse, wherein, in response to the sensing circuit sensing the second eFuse, the second eFuse provides a signal having a voltage level of VDD.

In some aspects, the memory circuit further includes a read access transistor coupled to each of the first memory cell and the second memory cell, wherein, in response to the read access transistor receiving a read bit line voltage, a sensing circuit coupled to the read access transistor senses at least one of the first memory cell or the second memory cell.

In some aspects, the memory circuit further includes a write access transistor coupled to each of the first memory cell and the second memory cell, wherein, in response to the write access transistor receiving a write bit line voltage, a voltage source coupled to the write access transistor programs at least one of the first memory cell or the second memory cell.

In some aspects of the present disclosure, a method is disclosed. In some aspects, the method includes during a first time period, receiving, through a word line coupled to a memory cell, a program voltage; and receiving, at a bulk port of the memory cell, a first bulk voltage; and during a second time period, receiving, through the word line, a read voltage; and receiving, at the bulk port, a second bulk voltage, wherein a first voltage level of the first bulk voltage is less than a second voltage level of the second bulk voltage.

In some aspects, the method further includes during the first time period receiving, in a sensing circuit coupled to the memory cell, a read disable voltage; and receiving, in a programming circuit coupled to the memory cell, a program enable voltage; and the method further includes during the second time period receiving, in the sensing circuit, a read enable voltage; and receiving, in the programming circuit, a program disable voltage.

In some aspects, the method further includes during the first time period, receiving, at a second bulk port of a second memory cell, the first bulk voltage; and the method further includes during the second time period, receiving, at the second bulk port, the second bulk voltage.

In some aspects, the method further includes during the first time period, receiving, at a second bulk port of a second memory cell, the first bulk voltage; and the method further includes during the second time period, receiving, at the second bulk port, the first bulk voltage.

In some aspects, the second voltage level is a positive, non-zero voltage and the first voltage is zero volts. In some aspects, each of the first voltage level and the second voltage is a positive, non-zero voltage.

In some aspects of the present disclosure, a memory device is disclosed. In some aspects, the memory device includes a substrate including a first portion and a second portion disposed over the first portion; a first bulk electrode of a first word line (WL) transistor disposed over the second portion of the substrate; a deep n-well disposed over the first portion of the substrate; a pair of n-wells disposed over the deep n-well; a p-well disposed over the deep n-well and in between the pair of n-wells; and a second bulk electrode of a second word line (WL) transistor disposed over the p-well.

In some aspects, the substrate includes a third portion disposed over the first portion of the substrate and opposite the p-well from the second portion of the substrate, the memory device further comprising a third bulk electrode of the second WL transistor disposed over the third portion of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
a plurality of memory cells, each of the plurality of memory cells including a resistor and a transistor coupled to each other in series; and
a sensing circuit including a read access transistor coupled to each of the plurality of memory cells, wherein respective bulk ports of the transistors of at least a first memory cell and a second memory cell of the plurality of memory cells are biased at different voltage levels, wherein, in response to the read access transistor receiving a read bit line voltage, the sensing circuit is configured to sense at least one of the first memory cell or the second memory cell.

2. The memory circuit of claim 1, wherein the first memory cell o comprises a first electronic fuse (eFuse).

3. The memory circuit of claim 2, wherein the second memory cell comprises a second eFuse.

4. The memory circuit of claim 2, wherein in response to the sensing circuit sensing the first eFuse, the first eFuse provides a signal having a voltage level of zero volts.

5. The memory circuit of claim 1, wherein a first bulk port of the transistor of the first memory cell is biased at a first voltage level.

6. The memory circuit of claim 5, wherein a second bulk port of the transistor of the second memory cell is biased at a second voltage level that is less than the first voltage level.

7. The memory circuit of claim 1, wherein the transistor of the first memory cell is a deep n-well (DNW) transistor and the transistor of the second memory cell is a bulk transistor.

8. The memory circuit of claim 1, wherein the transistor of the first memory cell and the transistor of the second memory cell are each deep n-well (DNW) transistors.

9. The memory circuit of claim 1, further comprising a write access transistor coupled to each of the first memory cell and the second memory cell.

10. The memory circuit of claim 1, wherein, in response to the write access transistor receiving a write bit line voltage, a voltage source coupled to the write access transistor programs at least one of the first memory cell or the second memory cell.

11. The memory circuit of claim 1, wherein the first memory cell and the second memory cell are each in series with a second resistor.

12. A memory circuit comprising:
a plurality of memory cells, each of the plurality of memory cells including a resistor and a transistor coupled to each other in series; and
a write access transistor coupled to each of the plurality of memory cells, wherein respective bulk ports of the transistors of at least a first memory cell and a second memory cell of the plurality of memory cells are biased at different voltage levels, wherein, in response to the write access transistor receiving a write bit line voltage, a voltage source coupled to the write access transistor programs at least one of the first memory cell or the second memory cell.

13. The memory circuit of claim 12, wherein the first memory cell is a first electronic fuse (eFuse) and the second memory cell is a second eFuse.

14. The memory circuit of claim 13, wherein the first eFuse is not programmed and the second eFuse is programmed.

15. The memory circuit of claim 13, further comprising a sensing circuit coupled to the first eFuse, wherein, in response to the sensing circuit sensing the first eFuse, the first eFuse provides a signal having a voltage level of zero volts.

16. The memory circuit of claim 12, wherein the resistor of the first memory cell is coupled to first routing having a first resistance and the resistor of the second memory cell is coupled to second routing having a second resistance greater than the first resistance.

17. The memory circuit of claim 12, wherein the transistor of the first memory cell is a deep n-well (DNW) transistor and the transistor of the second memory cell is a bulk transistor.

18. The memory circuit of claim 12, wherein the transistor of the first memory cell and the transistor of the second memory cell are each deep n-well (DNW) transistors.

19. A memory device comprising:
- a substrate including a first portion and a second portion disposed over the first portion;
- a first bulk electrode of a first word line (WL) transistor disposed over the second portion of the substrate;
- a deep n-well disposed over the first portion of the substrate;
- a pair of n-wells disposed over the deep n-well;
- a p-well disposed over the deep n-well and in between the pair of n-wells;
- a second bulk electrode of a second word line (WL) transistor disposed over the p-well; and
- a write access transistor coupled to each of the first bulk electrode and the second bulk electrode, wherein, in response to the write access transistor receiving a write bit line voltage, a voltage source coupled to the write access transistor provides a voltage signal to the first bulk electrode and the second bulk electrode.

20. The memory device of claim 19, further comprising a third bulk electrode of the second WL transistor disposed over a third portion of the substrate.

* * * * *